United States Patent
Fan et al.

(10) Patent No.: US 8,544,967 B2
(45) Date of Patent: Oct. 1, 2013

(54) SERVER RACK

(75) Inventors: Chen-Lu Fan, Tu-Cheng (TW);
 Jing-Chao Liang, Shenzhen (CN)

(73) Assignees: Hong Fu Jin Precision Industry (ShenZhen) Co., Ltd., Shenzhen (CN);
 Hon Hai Precision Industry Co., Ltd., New Taipei (TW)

(*) Notice: Subject to any disclaimer, the term of this patent is extended or adjusted under 35 U.S.C. 154(b) by 230 days.

(21) Appl. No.: 13/152,403

(22) Filed: Jun. 3, 2011

(65) Prior Publication Data
 US 2012/0061335 A1 Mar. 15, 2012

(30) Foreign Application Priority Data
 Sep. 9, 2010 (CN) .......................... 2010 1 0277230

(51) Int. Cl.
 *A47B 88/00* (2006.01)
(52) U.S. Cl.
 USPC ............. 312/223.2; 312/265.4; 312/329; 312/222
(58) Field of Classification Search
 USPC ......... 312/265.1, 265.4, 326, 329, 223.2, 312/223.3, 222, 215; 49/394, 395; 361/724–727; 292/194, 195, 198, 256.69, 292/247, DIG. 49
 See application file for complete search history.

(56) References Cited

U.S. PATENT DOCUMENTS

| | | | | |
|---|---|---|---|---|
| 1,820,715 | A * | 8/1931 | Vance | 70/81 |
| 5,461,892 | A * | 10/1995 | Hsieh | 70/73 |
| 6,036,290 | A * | 3/2000 | Jancsek et al. | 312/265.4 |
| 6,681,604 | B1 * | 1/2004 | Samsel | 70/78 |
| 7,278,695 | B2 * | 10/2007 | Fromme et al. | 312/217 |
| 7,568,739 | B2 * | 8/2009 | Lee | 292/80 |
| 7,909,419 | B2 * | 3/2011 | Vinke | 312/215 |
| 8,333,412 | B2 * | 12/2012 | Hamblin | 292/36 |
| 2002/0153814 | A1* | 10/2002 | Robideau | 312/265.4 |
| 2011/0291852 | A1* | 12/2011 | Forristal et al. | 340/686.1 |
| 2012/0200213 | A1* | 8/2012 | Savage et al. | 312/326 |

* cited by examiner

Primary Examiner — Daniel Rohrhoff
(74) Attorney, Agent, or Firm — Altis & Wispro Law Group, Inc.

(57) ABSTRACT

A server rack includes a frame, a front plate and a mounting device. The frame includes a latch. The front plate is secured to the frame and includes an assistant plate. The mounting device is located on the front plate and includes a mounting plate and a mounting bracket. The mounting plate is slidably secured to the assistant plate. The mounting bracket is configured for sliding the mounting plate towards the assistant plate between a mounting position, when the mounting plate is engaged with the latch, and an unlocked position, when the mounting plate is disengaged from the latch.

20 Claims, 7 Drawing Sheets

SERVER RACK

BACKGROUND

1. Technical Field

The present disclosure relates to a server rack, and particularly to a server rack that has a front plate that can be conveniently opened and closed.

2. Description of Related Art

A server rack houses electronic equipment, such as data storage devices and power supplies. The server rack usually includes two rectangular frames, a plurality of supports connected to the two rectangular frames, and a front plate secured among the two rectangular frames and the supports. The front plate can be opened when a server is needed to be inserted in or removed from the sever rack.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
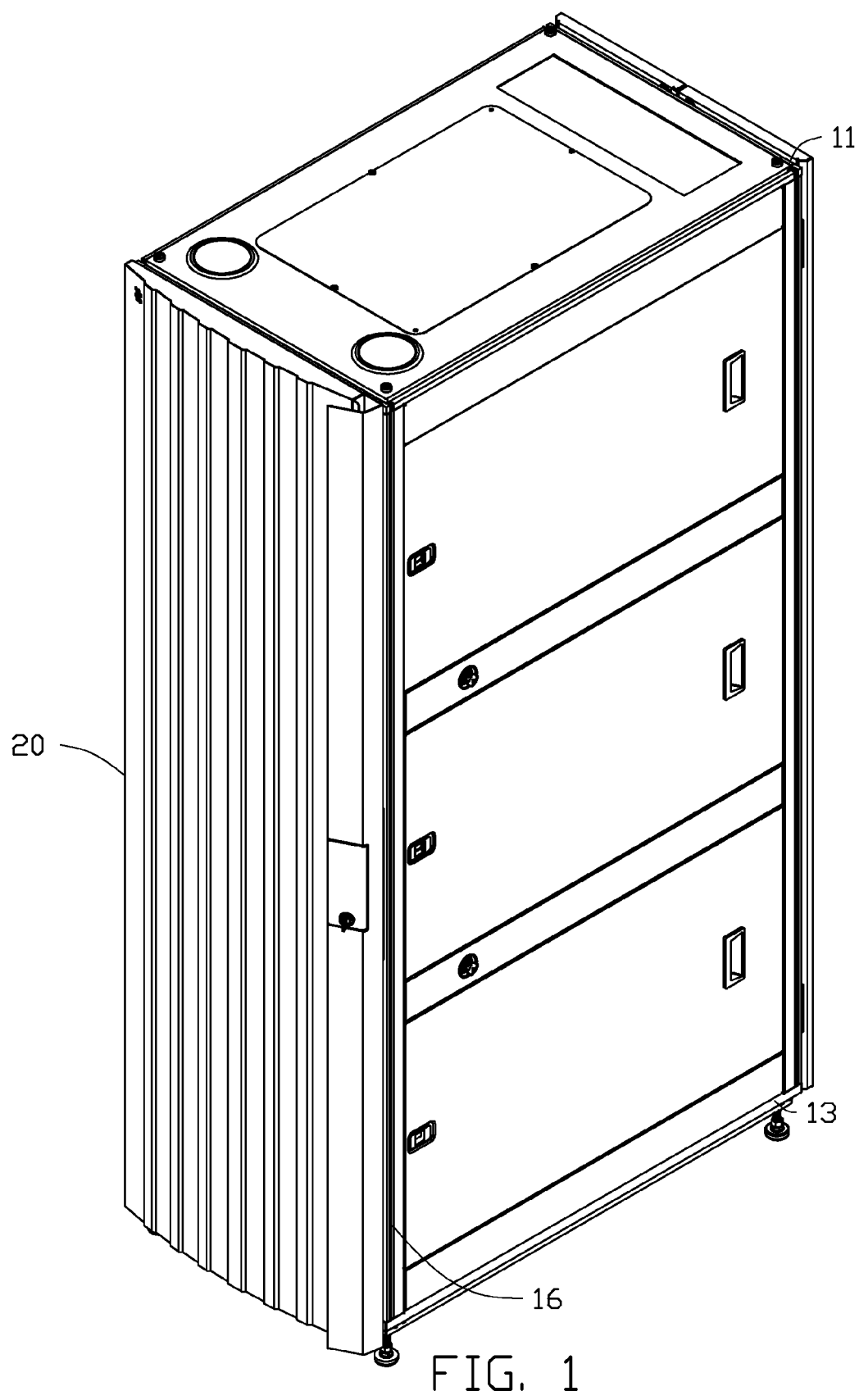
FIG. 1 is an isometric view of a server rack in accordance with an embodiment.
Figure 2:
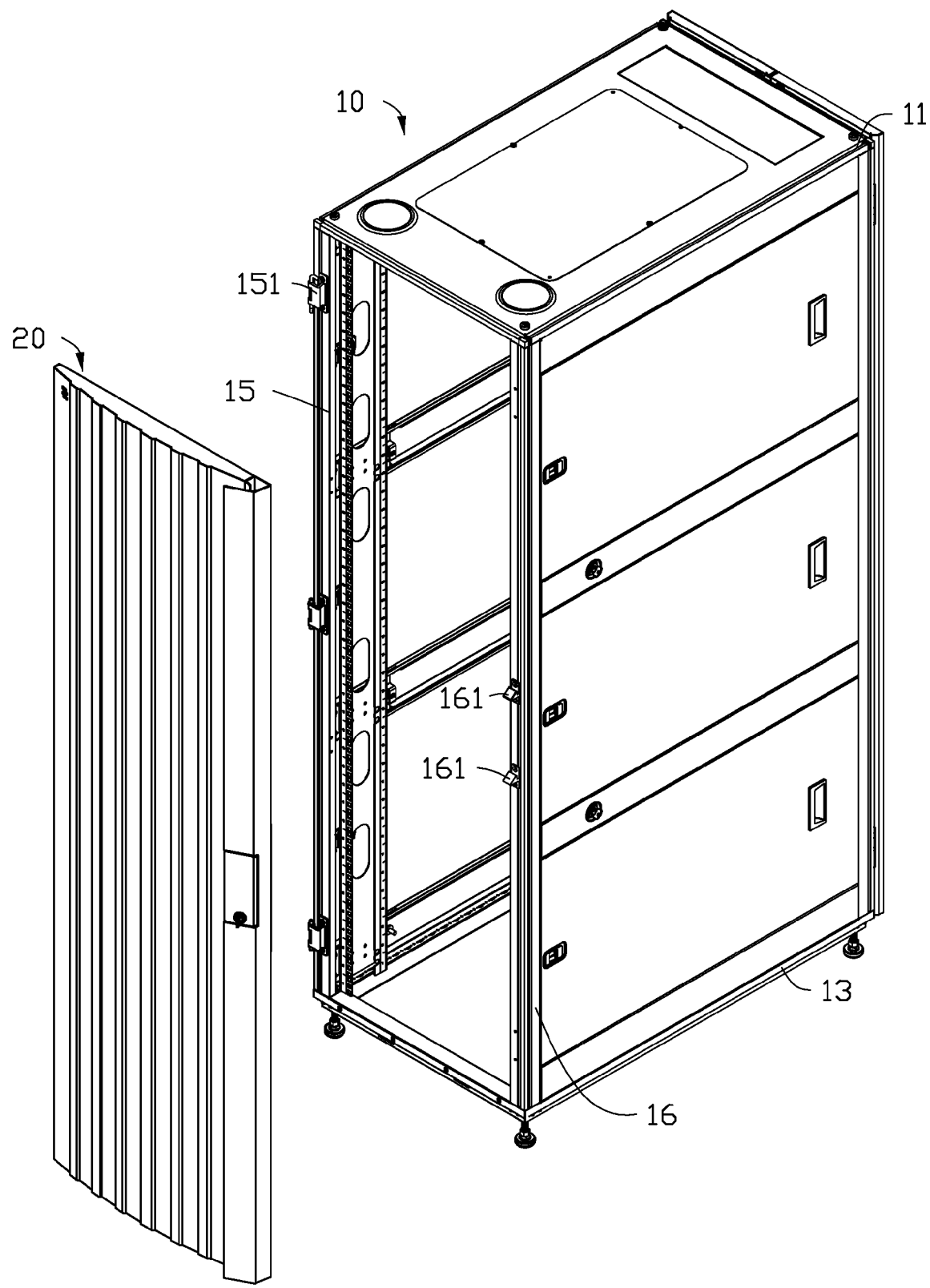
FIG. 2 is an exploded, isometric view of FIG. 1.

Referring to FIG. 1 and FIG. 2, a server rack in accordance with an embodiment includes a shell 10 and a front plate 20.

The shell 10 includes a top frame 11, a bottom frame 13, a first support 15, and a second support 16. The first support 15 and the second support 16 are located between the top frame 11 and the bottom frame 13. A plurality of hinges 151 are secured to the first support 15. Two latches 161 are secured to the second support 16.

Figure 3:
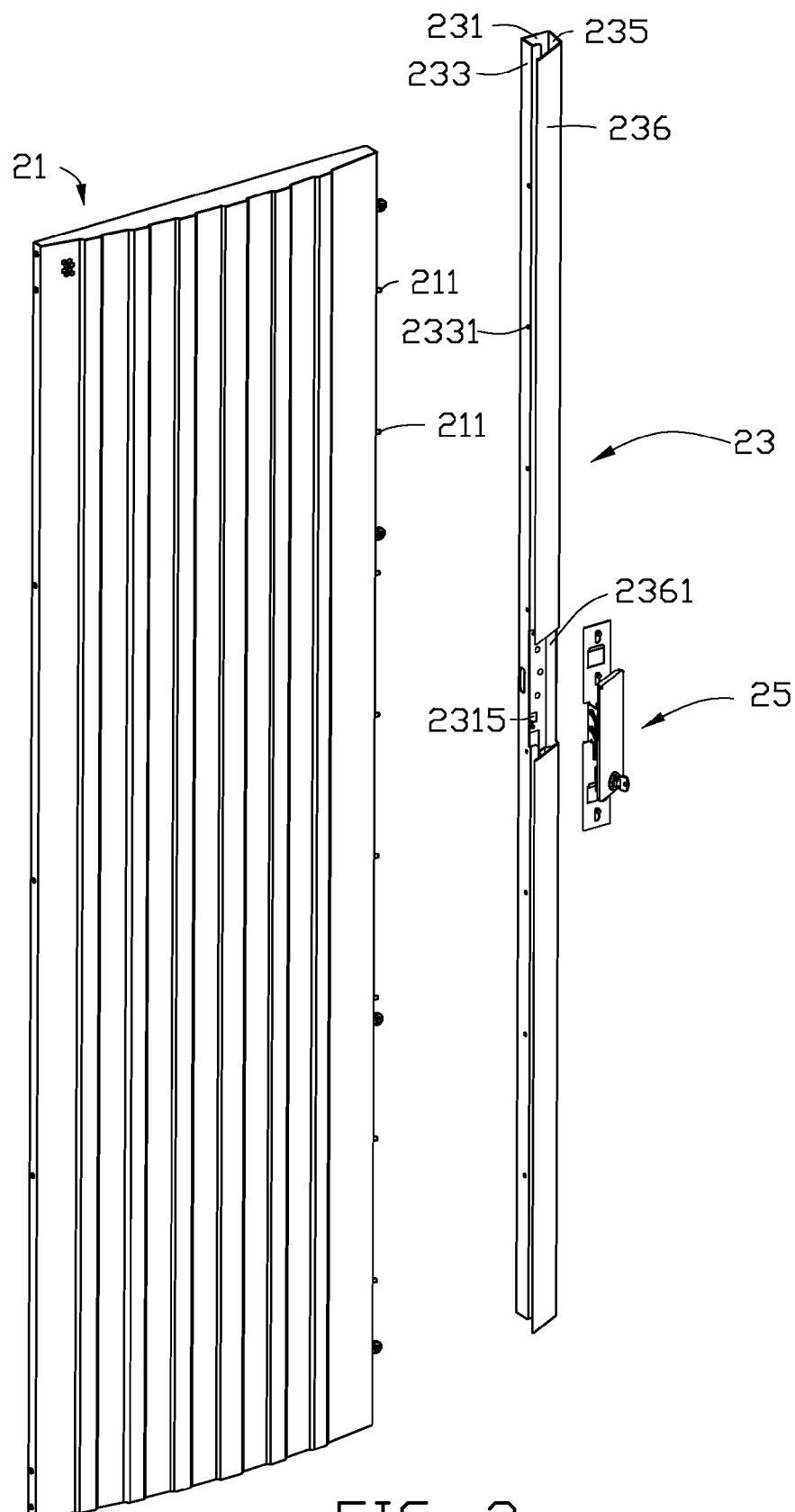
FIG. 3 is an exploded, isometric view of a front plate of the server rack of FIG. 2.
Figure 4:
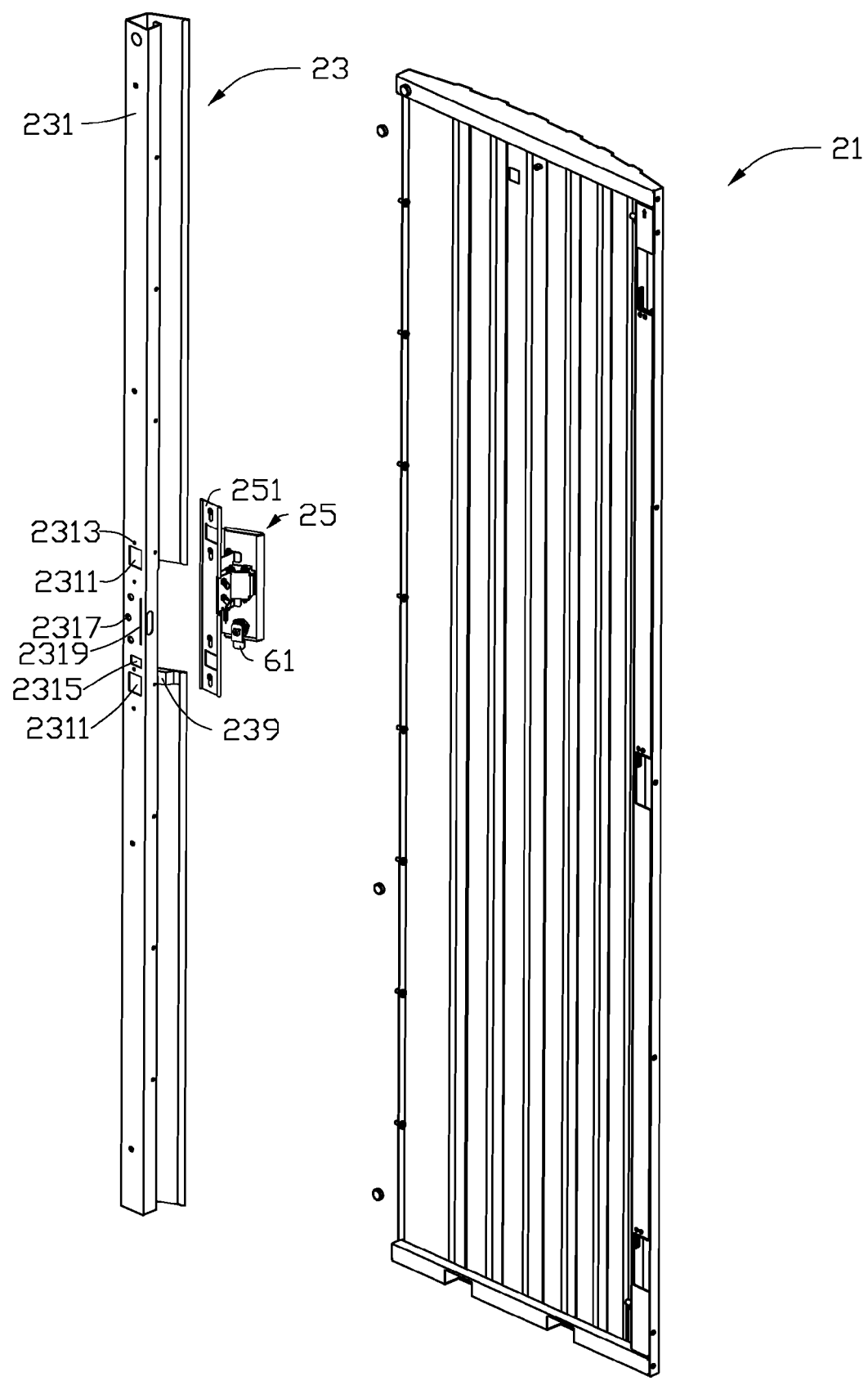
FIG. 4 is similar to FIG. 3, but viewed in a different aspect.

Referring to FIG. 3 and FIG. 4, the front plate 20 includes a main plate 21 and an assistant plate 23. A first side of the main plate 21 is capable of being secured to the two hinges 151 and being rotated relative to the shell 10. A plurality of mounting posts 211 is located on a second side of the main plate 21. The second side is opposite to the first side. The assistant plate 23 includes a rear wall 231, a first sidewall 233, a second sidewall 235, and a front wall 236. The rear wall 231 is connected to the first sidewall 233 and the second sidewall 235. The front wall 236 extends from the second sidewall 235 towards the first sidewall 233. The rear wall 231 defines two first openings 2311, a second opening 2315, a plurality of first locking holes 2313 and second locking holes 2317, and a gap 2319. The first sidewall 233 defines a plurality of limiting holes 2331. The front wall 236 defines a notch 2361. A mounting piece 239 is secured to the inner surface of the front wall 236 adjacent the bottom edge of the notch 2361. In one embodiment, the rear wall 231 is substantially perpendicular to the first sidewall 233 and the second sidewall 235, and the first sidewall 233 is substantially parallel to the second sidewall 235.

Figure 5:
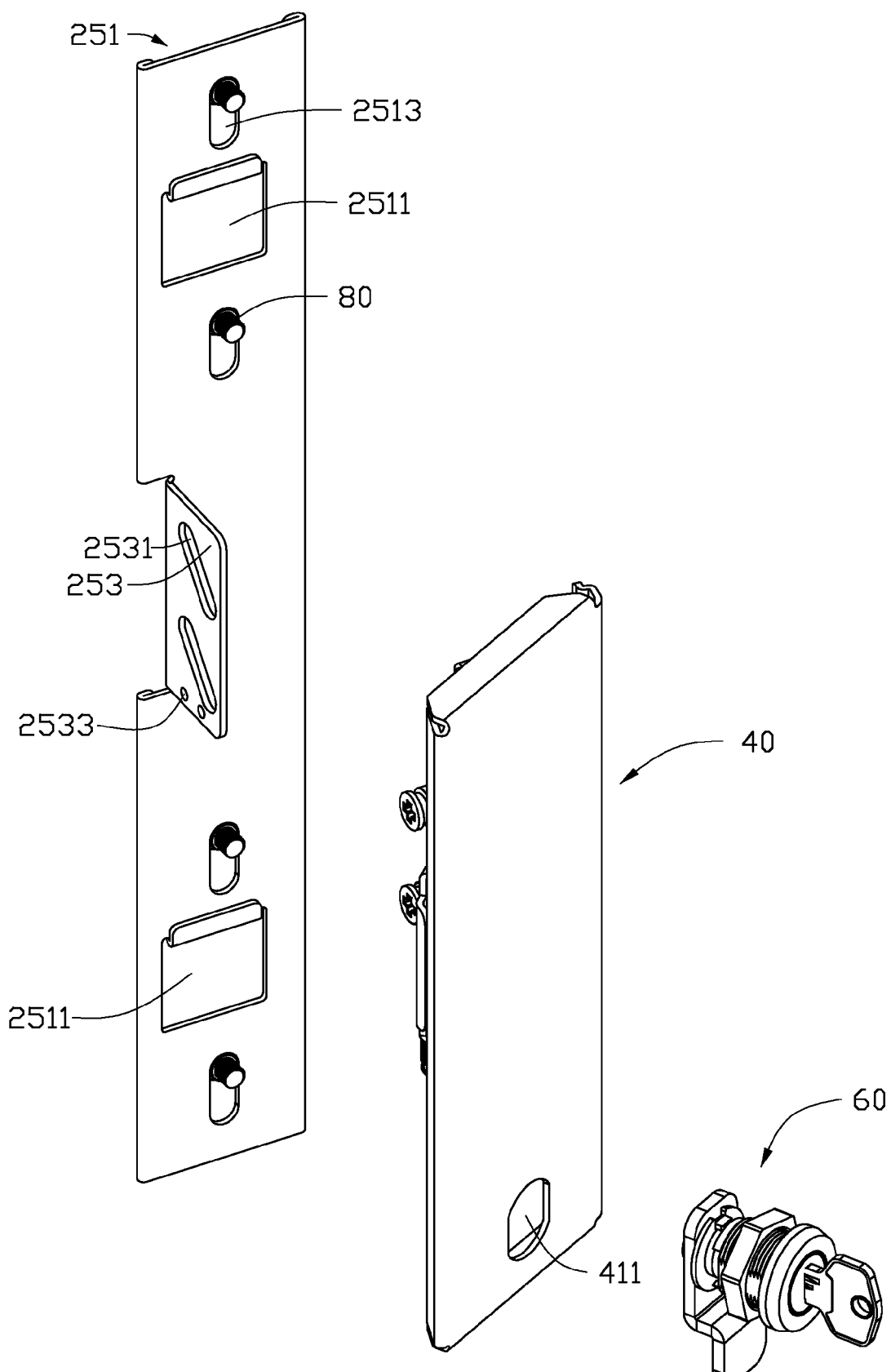
FIG. 5 is an exploded, isometric view of a mounting device of FIG. 3.

Referring to FIG. 5, a mounting device 25 is secured to the front plate 20 and includes a mounting plate 251, a mounting bracket 40, and a locking member 60.

A limiting piece 253 extends from a side edge of the mounting plate 251. The mounting plate 251 defines two third openings 2511 and a plurality of first slots 2513. In one embodiment, the first slots 2513 extend along a vertical direction. The limiting piece 253 defines two second slots 2531 and two first mounting holes 2533. In one embodiment, an angle is defined between the second slot 2531 and the vertical direction.

Figure 6:
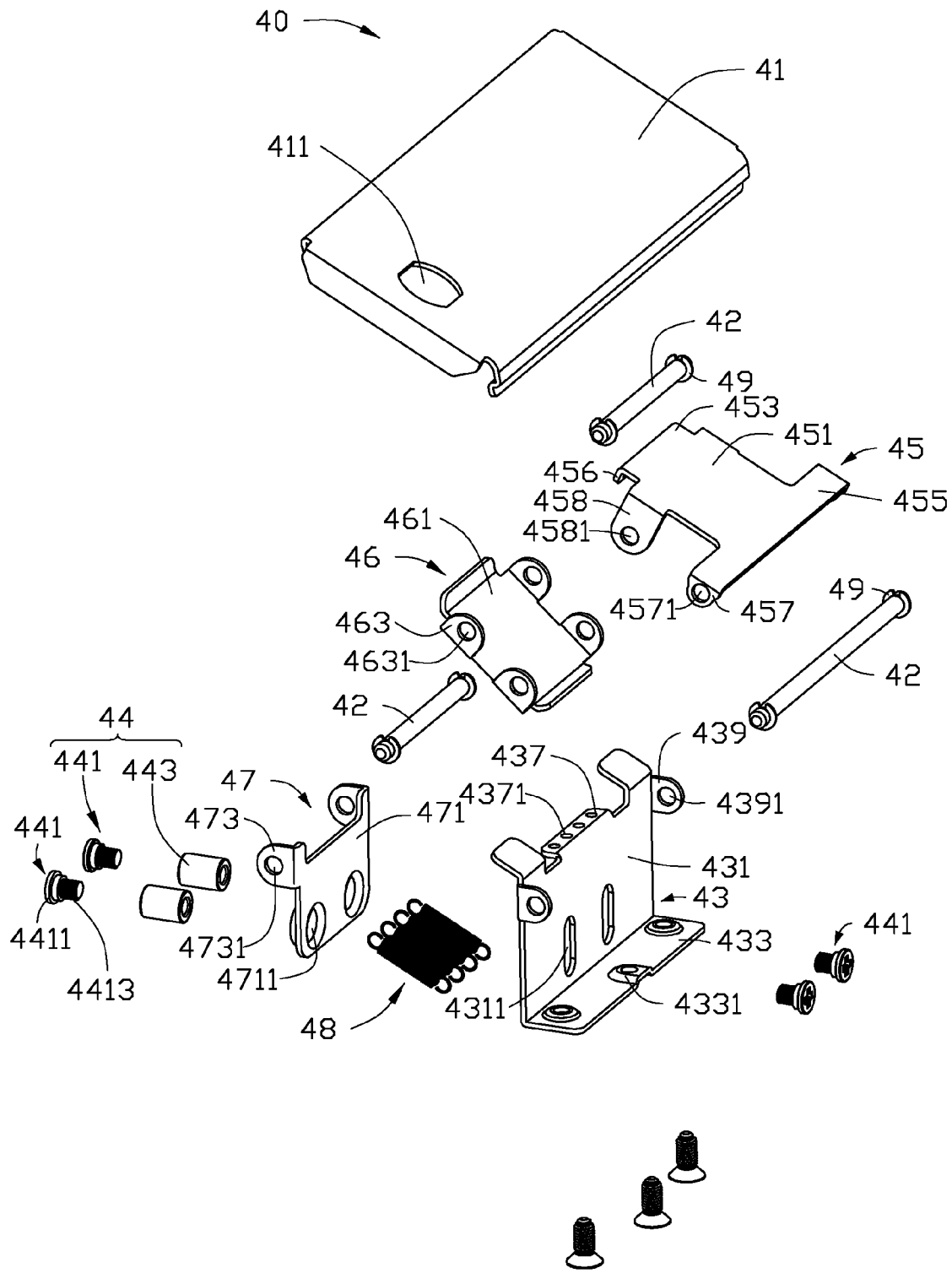
FIG. 6 is an exploded, isometric view of FIG. 5.
Figure 7:
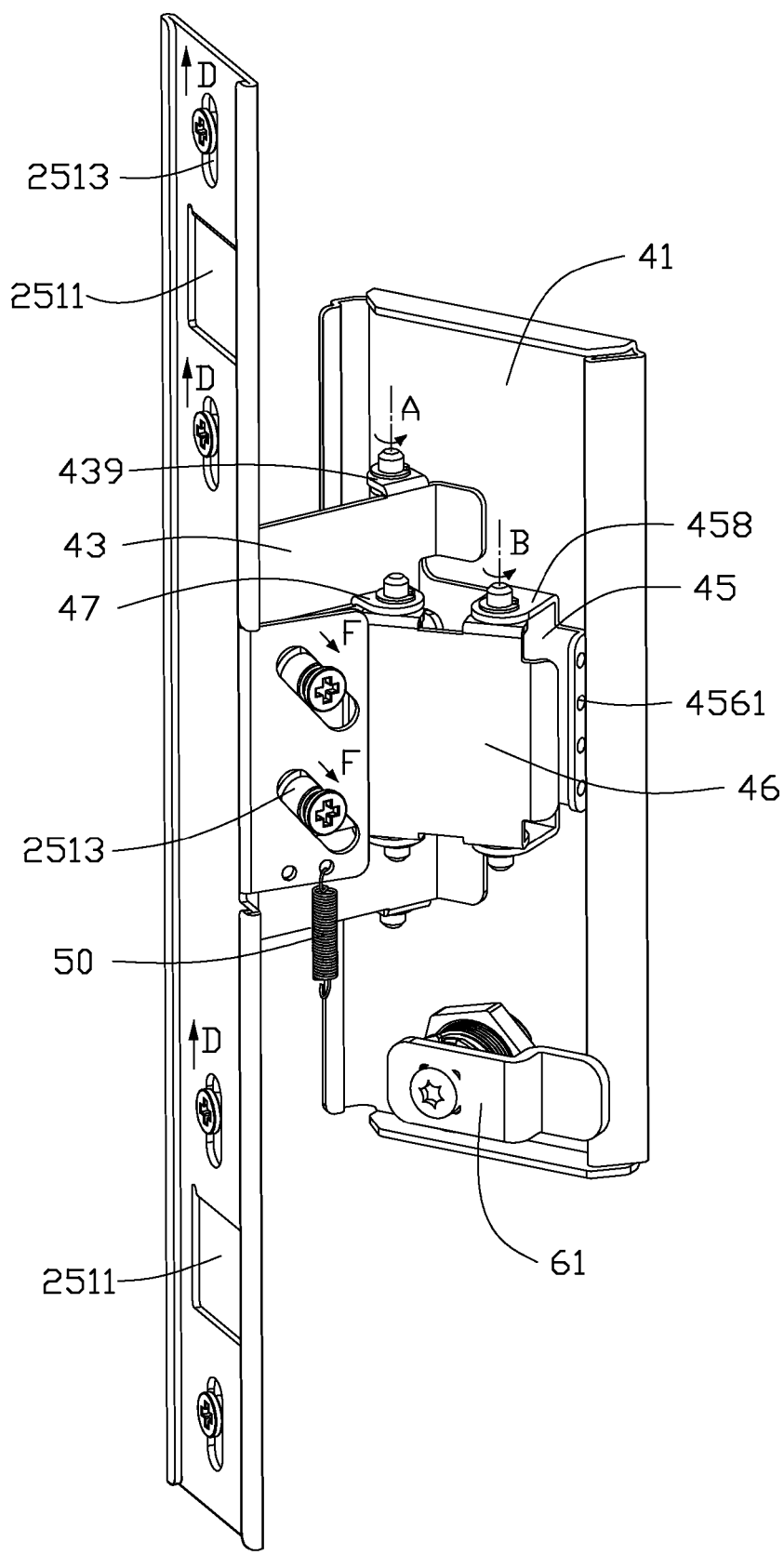
FIG. 7 is an assembled view of the mounting device.

Referring to FIG. 6, the mounting bracket 40 includes a handle 41, a base 43, a first mounting member 45, a second mounting member 46, a third mounting member 47, and two connecting members 44.

The handle 41 defines a fourth opening 411 for receiving a locking member 60.

The base 43 includes a first body 431 and a bottom end 433. The first body 431 defines a third slot 4311. The bottom end 433 extends from a bottom edge of the first body 431. A plurality of third locking holes 4331 is defined in the bottom end 433, corresponding to the second locking holes 2317. A first flange 437 extends from a top edge of the first body 431 and defines a plurality of second mounting holes 4371. Two first securing pieces 439 extend from two opposite side edges of the first body 431. Each first securing piece 439 defines a first securing hole 4391. In one embodiment, the first body 431 is substantially perpendicular to the bottom end 433, and the first flange 437 and the two first securing pieces 439 are substantially perpendicular to the first body 431.

The first mounting member 45 includes a second body 451. A second flange 456 extends from a front end of the second body 451 and defines a plurality of third mounting holes 4561. Two second securing pieces 457 extend from two opposite side edges of the second body 451. Each second securing piece 457 defines a second securing hole 4571. Two third securing pieces 458 extend from the two opposite side edges of the second body 451. Each third securing piece 458 defines a third securing hole 4581. In one embodiment, the second body 451 is secured to the inner surface of the handle 41 by a securing method, such as soldering or riveting.

The second mounting member 46 includes a third body 461. Two first positioning pieces 463 extend from two opposite side edges the third body 461. Each first positioning piece defines a first positioning hole 4631. Two second positioning pieces 465 extend from the two opposite side edges of the third body 461. Each second positioning piece defines a second positioning hole 4651.

The third mounting member 47 includes a fourth body 471. Two third positioning pieces 473 extend from two opposite side edges of the fourth body 471. Each third positioning piece 473 defines a third positioning hole 4731. The third mounting member 47 defines two through holes 4711.

Each connecting member 44 includes two first linking members 441 and a second linking member 443. The two first linking members 441 are configured for being secured to two opposite ends of the second linking member 443. In one embodiment, the two linking members 441 can be screws, and the second linking member 443 is a hollow cylinder ring.

Each first linking member 441 includes a first linking portion 4411 and a second linking portion 4413.

In assembly of the mounting bracket 40, the first mounting member 45 is secured to the handle 41. A first shaft 421 is inserted into the two first securing holes 4391 and the two second securing holes 4571. Two first clasps 491 are engaged with two opposite ends of the first shaft 421. A second shaft 422 is inserted into the two third securing holes 4581 and the two first positioning holes 4631. Two second clasps 492 are engaged with two opposite ends of the second shaft 422. A third shaft 423 is inserted into the two second positioning holes 4651 and the two third positioning holes 4731. Two third clasps 493 are engaged with two opposite ends of the third shaft 423. The first mounting member 45 is rotatably secured to the base 43. The second mounting member 46 is rotatably secured to the first mounting member 45. The third mounting member 47 is rotatably secured to the second mounting member 46. Each second mounting hole 4371 together with one third mounting hole 4561 corresponding to the second mounting hole 4371 receives opposite ends of a first spring 48.

In assembly of the front plate 20, a plurality of locking members, such as screws, is inserted into the first locking hole 4331 and the second locking hole 2317, to secure the base 43 to the assistant plate 23. The limiting piece 253 is located in the assistant plate 23 from the outer surface of the rear wall 231 via the gap 2319. The mounting plate 251 abuts the outer surface of the rear wall 231. A second spring 50 is engaged in the second opening 2315 and the first mounting hole 2533. A top end of each first slot 2513 is aligned with each first locking hole 2313. A part of each first opening 2311 is aligned with a part of each third opening 2511. A plurality of screws 80 is engaged in the first slots 2513 and the first locking holes 2313, to slidably secure the mounting plate 251 to the assistant plate 23. The mounting posts 211 are engaged in the limiting holes 2331, and the main plate 21 is secured to the assistant plate 23 thereby.

The two first linking members 441 are engaged with the two second linking members 443 via the two third slots 4311 and the two through holes 4711. The two second linking members 443 are engaged in the two second slots 2531. The third mounting member 47 is slidably secured to the mounting plate 251.

The front plate 20 is rotatably secured to the frame 10. The mounting device 25 and the assistant plate 23 are secured to the main plate 21.

The locking member 60 is secured in the fourth opening 411 of the handle 40 and includes a locking tongue 61 and a key 65. The locking tongue 61 is capable of rotating between a first position and a second position with the key 65. When the locking tongue 61 is in the first position, the locking tongue 61 is disengaged from the mounting piece 239, and the handle 41 is capable of rotating opposite to the assistant plate 23. When the locking tongue 61 is in the second position, the locking tongue 61 abuts the mounting piece 239, for preventing the handle 41 from rotating opposite to the assistant plate 23.

The front plate 20 is capable of being rotated between an open position and a close position opposite to the frame 10. When the front plate 20 is in the open position, the latch 161 is disengaged from the mounting plate 251, and the locking tongue 61 is in the first position. When the front plate 20 is in the closed position, the latch 161 is engaged in the third opening 2511. When the front plate 20 is positioned in the open position or in the close position, the first springs 48 and the second springs 50 are positioned in an initial state and have a minimum length, and the mounting plate 251 is positioned in a mounting position.

In the process of rotating the front plate 20 from being opened to close, the latch 161 is inserted into the first opening 2311 and abuts a top edge of the third opening 2511. The latch 161 presses the top edge of the third opening 2511 to slide the mounting plate 251 along a direction "D". The second spring 50 is elastically deformed. When the latch 161 is over the top edge of the third opening 2511, the mounting plate 251 is in an unlocked position, and the second spring 50 is elastically deformed at a maximum. After the latch 161 passes through the third opening 2511, the second spring 50 elastically returns to the initial state. The mounting plate 251 is slid from the unlocked position to the mounting position along a direction opposite to the direction "D", and the latch 161 is engaged with the mounting plate 251. Thus, the front plate 20 is closed. The locking tongue 61 is rotated from the first position to the second position with the key 65, to prevent the front plate 20 from being opened.

When the front plate 20 is rotated from being closed to open, the locking tongue 61 is rotated from the second position to the first position with the key 65. The handle 41 is rotated along a direction "A", and the first mounting member 45 is rotated towards the direction "A" following the handle 41. The first springs 48 are elastically deformed. The first mounting member 45 rotates the second mounting member 46 along a direction "B". The second mounting member 46 drives the third mounting member 47 to rotate towards a direction opposite to the direction "C" opposite to the second mounting member 46. Because the third mounting member 47 is slid secured to the second slot 2531 and the third slot 4311, the mounting plate 251 and the base 43 are pulled by the connecting members 44 exerted from the third mounting member 47. Because the second slot 2531 is declining, the third mounting member 47 slides the mounting plate 251 towards a direction "F", until the third mounting member 47 is unlocked, and the latch 161 is disengaged from the mounting plate 251. The front plate 20 is rotated from closed to open. The handle 41 is released, the first springs 48 elastically returns to drive the handle 41 to rotate in reverse, and the mounting plate 251 is slid from being unlocked to the mounting position.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:
1. A server rack comprising:
a frame comprising a latch;
a front plate comprising a main plate and an assistant plate; and
a mounting device positioned on the assistant plate;
wherein a first side of the main plate is rotatably mounted to the frame, the assistant plate is secured to a second side of the main plate, and the first side of the main plate is opposite to the second side of the main plate; the mounting device comprises a mounting plate and a mounting bracket, the mounting plate is slidably secured to the assistant plate, and the mounting bracket is adapted to slide the mounting plate to engage with the latch or be disengaged from the latch.

2. The server rack of claim 1, wherein the mounting plate defines a first slot extending along a vertical direction, and the mounting plate is slid along the vertical direction.

3. The server rack of claim 2, wherein the mounting device further comprises a limiting piece extending from the mounting plate, the limiting piece defines a second slot, and an angle is defined between the second slot and the vertical direction.

4. The server rack of claim 1, wherein the mounting bracket comprises a base secured to the assistant plate and a first mounting member rotatably mounted to the base.

5. The server rack of claim 4, wherein the mounting bracket further comprises a a second mounting member and a third mounting member; the first mounting member is further rotatably secured to the second mounting member, and the third mounting member is rotatably secured to the second mounting member.

6. The server rack of claim 5, wherein the mounting bracket further comprises a handle adapted to rotate the mounting bracket, and the first mounting member is secured to the handle.

7. The server rack of claim 6, wherein the assistant plate comprises a front wall, and the front wall defines a notch adapted to receive the handle.

8. The server rack of claim 7, further comprising a mounting piece secured to the front wall, and a locking member secured to the handle and comprising a locking tongue, the locking tongue is capable of rotating between a first position and a second position, the first position is when the locking tongue is disengaged from the mounting piece, and the second position is when the locking tongue abuts the mounting piece.

9. The server rack of claim 5, wherein the base defines a third slot, and the third mounting member is slid along the third slot towards the base.

10. The server rack of claim 4, wherein a spring is secured to the base and the first mounting member.

11. A server rack comprising:
a frame comprising a latch;
a front plate comprising a main plate and an assistant plate;
a mounting plate slidably secured to the assistant plate;
wherein a first side of the main plate is rotatably mounted to the frame, the assistant plate is secured to a second side of the main plate, and the first side of the main plate is opposite to the second side of the main plate; the mounting plate is capable of sliding towards the assistant plate between a mounting position and an unlocked position, the mounting position is when the mounting plate is engaged with the latch, and the unlocked position is when the mounting plate is disengaged from the latch.

12. The server rack of claim 11, wherein the mounting plate defines a first slot, the first slot extends along a vertical direction, and the mounting plate is slid along the vertical direction.

13. The server rack of claim 12, wherein the mounting device further comprises a limiting piece extending from the mounting plate, the limiting piece defines a second slot, and an angle is defined between the second slot and the vertical direction.

14. The server rack of claim 11, further comprising a mounting device comprising the mounting plate and a mounting bracket adapted to slide the mounting plate.

15. The server rack of claim 14, wherein the mounting bracket comprises a base secured to the assistant plate and a first mounting member rotatably mounted to the base.

16. The server rack of claim 15, wherein the mounting bracket further comprises a a second mounting member and a third mounting member; the first mounting member is further rotatably secured to the second mounting member, and the third mounting member is rotatably secured to the second mounting member.

17. The server rack of claim 16, wherein the mounting bracket further comprises a handle adapted to rotate the mounting bracket, and the first mounting member is secured to the handle.

18. The server rack of claim 17, wherein the assistant plate comprises a front wall, and the front wall defines a notch adapted to receive the handle.

19. The server rack of claim 18, wherein a mounting piece is secured to the front wall, a locking member is secured to the handle and comprises a locking tongue, and the locking tongue is capable of rotating between a first position and a second position, the first position is when the locking tongue is disengaged from the mounting piece, and the second position is when the locking tongue abuts the mounting piece.

20. The server rack of claim 15, wherein a spring is secured to the base and the first mounting member.

* * * * *